United States Patent [19]
Yamaguchi

[11] Patent Number: 4,704,720
[45] Date of Patent: Nov. 3, 1987

[54] DISTRIBUTED-FEEDBACK SEMICONDUCTOR LASER

[75] Inventor: Masayuki Yamaguchi, Tokyo, Japan

[73] Assignee: NEC Corporation, Tokyo, Japan

[21] Appl. No.: 688,132

[22] Filed: Jan. 2, 1985

[30] Foreign Application Priority Data

Jan. 9, 1984 [JP] Japan ................... 59-1641

[51] Int. Cl.$^4$ ............................... H01S 3/19
[52] U.S. Cl. .......................... 372/96; 372/45
[58] Field of Search .............. 372/96, 45, 46; 357/17

[56] References Cited

U.S. PATENT DOCUMENTS 4,178,604 12/1979 Nakamura et al. ................... 372/96

OTHER PUBLICATIONS

CW Operation of DFB-BH GaInAsP/InP Lasers in 1-5 μm Wavelength Region—T. Matsuoka, Nov. 30, 1981, Electronic Letters Jan. 7, 1982, vol. 18—No. 1 pp. 27–28.

*Primary Examiner*—James W. Davie
*Attorney, Agent, or Firm*—Sughrue, Mion, Zinn, Macpeak & Seas

[57] ABSTRACT

A distributed feedback semiconductor laser in which the waveguide on one side of the active layer consists of two layers forming a corrugation pattern therebetween to create a Bragg grating. The refractive index of the inner layer, with respect to the active layer is less than that of the outer layer and the refractive index of the outer layer is less than that of the active layer.

8 Claims, 9 Drawing Figures

DISTRIBUTED-FEEDBACK SEMICONDUCTOR LASER

BACKGROUND OF THE INVENTION

The present invention relates to a single longitudinal mode semiconductor laser, and more particularly to a semiconductor laser having a distributed feedback structure.

Optical fiber communication has now reached a stage of practical application as enabled by the reduction of losses in optical fibers and the improvement of semiconductor laser performance. The attraction of optical fiber communication lies above all in the long-distance high-capacity transmission it permits. Optical fibers, however, vary in transmission velocity with optical wavelength (wavelength dispersion), and semiconductor lasers used as light sources oscillate during high-speed modulation in multiaxial modes (in a plurality of modes having different wavelengths) and are thus susceptible to signal waveform degradation in high-capacity long-distance transmission. To solve these problems, many attempts are under way to develop a single longitudinal mode semiconductor laser oscillating in a single longitudinal mode even during high-speed modulation.

Single longitudinal mode semiconductor lasers include distributed-feedback semiconductor lasers (DFB lasers). A DFB laser usually has a structure in which a grating is formed in an optical guide layer provided in the vicinity of an active layer. The DFB laser, utilizing periodic variations of the refractive index resulting from the presence of the grating, oscillates in a single longitudinal mode around the Bragg wavelength of this grating. In order to achieve satisfactory single longitudinal mode oscillation, a DFB laser requires efficient coupling between the grating and the optical field. Therefore, the most suitable position where the grating is to be formed is an area in which there is a strong optical field. In other words, as light rays propagate through the active layer and the optical guide layer, their intensity is the greatest in or around the area between the active and optical guide layers, and it is desirable to form the grating in this area. However, in most of the previously produced DFB lasers, the grating is formed on the side of the optical guide layer farther from the active layer, where the optical field is relatively weak. (See, for example, T. Matsuoka et al., "CW Operation of DFB-BH GaInAsP/InP Lasers in 1.5 μm Wavelength Region", ELECTRONICS LETTERS, Vol. 18 (1982), No. 1, pp. 27-28). Accordingly, the index K which represents the coupling efficiency between the grating and the optical field is no greater than approximately 40 cm$^{-1}$, resulting in the problem that increasing the injected current would invite oscillation at the Fabry-Perot mode instead of oscillation in a single wavelength.

SUMMARY OF THE INVENTION

An object of the present invention, therefore, is to provide a DFB laser having a periodic refractive index distribution in the strongest part of the optical field and capable of satisfactory oscillation in a single longitudinal mode.

A semiconductor laser according to the invention has a stratified structure in which a semiconductor layer having a lower refractive index than those of an active layer and an optical guide layer is buried with a periodic thickness distribution between the active layer and the optical guide layer.

More specifically, the structure of a distributed-feedback (DFB) semiconductor laser diode comprises: an active layer emitting light rays upon injection of an electric current; and an optical waveguide, adjoining and cooperating with the active layer, for guiding the light rays. The optical waveguide comprises a first semiconductor layer formed in the vicinity of the active layer and having a greater bandgap than that of the active layer. The thickness of the first semiconductor layer varies parallel toward the direction of the active layer according to a corrugation pattern of a prescribed. The waveguide further includes a second semiconductor layer having a bandgap smaller than that of the first semiconductor layer but greater than that of the active layer and so formed as to conform to the corrugation of the first semiconductor layer. The DFB laser diode further includes first and second cladding layers adjoining the active layer and the optical waveguide, respectively, and both cladding layers having bandgaps greater than either of the active layer and of second semiconductor layer. First and second electrodes inject an electric current into the active layer, wherein a PN junction is formed in the active layer by forward biasing. The light rays emitted from the active layer interact with the diffraction grating formed by the boundary of the corrugation to receive positive feedback, resulting in laser oscillation.

In semiconductor materials, generally, the greater the bandgap energy, the shorter the light emitting wavelength corresponding to that particular bandgap, and the wider the bandgap, the smaller the refractive index. In this specification, the magnitude of the bandgap energy or the bandgap wavelength will be referred to as required in place of the level of the refractive index.

DETAILED DESCRIPTION OF THE PREFERRED EMBODIMENTS

Figure 1A:
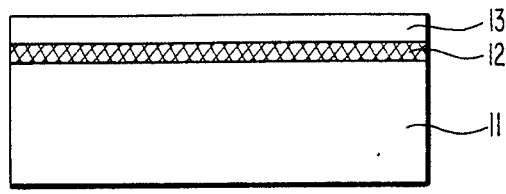
FIGS. 1a and 1b are longitudinal sections illustrating the fabrication process of a first preferred embodiment of the press invention.
Figure 1B:
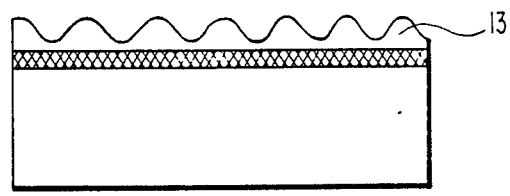
Figure 1C:
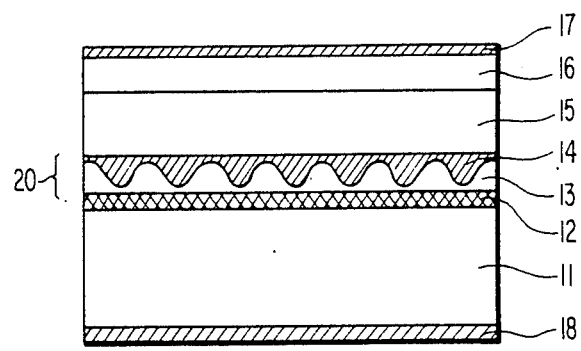
FIG. 1c is a longitudinal section, along the laser oscillation axis, of the first preferred embodiment of the invention.

Referring to FIG. 1c, a DFB laser diode (LD) according to the present invention comprises an active layer 12, emitting light rays upon injection of an electric current, an optical guide 20 for guiding the light rays emanating from the thin active layer 12, a cladding layer 15, and a contact layer 16, all formed over a substrate 11. Over the bottom of the substrate 11 and the upper face of the contact layer 16 are formed a negative electrode 18 and a positive electrode 17, respectively. Every layer other than the electrodes 17 and 18 is composed of a semiconductor material. The optical waveguide 20 comprises a low refractive index layer 13, made of a material having a lower refractive index than that of the active layer 12, and a high refractive index layer 14, made of a material having a refractive index lower than that of the active layer 12 but higher than that of the low refractive index layer 13, that is $n_{13} < n_{14} < n_{12}$, where $n_i$ is the refractive index of the respective numbered layer. Alternatively, in terms of bandgap energy $Eg_{13} > Eg_{14} > Eg_{12}$. The low refractive index layer 13, consists of a first semiconductor layer 13, whose thickness periodically varies in a corrugation Eg; pattern parallel to the active layer 12. The high refractive index layer 14 consists of a second semiconductor layer 14 whose thickness periodically varies to conform to the corrugation of the first semiconductor layer 13. The first and second semiconductor layers constitute a diffraction grating at the boundary of the corrugation. As the electrodes 17 and 18 are forward biased, the light rays emanating from the active layer 12 interact with the differing diffraction index of the waveguide 20, and oscillate at a Bragg wavelength determined by the pitch of the corrugation. The cladding layer 15 has a smaller refractive index than that of second semiconductor layer 14 and, together with the substrate 11 which has a small refractive index than that of the active layer 12 and functions as a cladding region, confines the light rays.

Now will be described the fabrication process for the DFB LD with reference to FIGS. 1a and 1b.

Referring first to FIG. 1a, over the substrate 11 of n-InP (bandgap wavelength $\lambda g = 0.92$ micron) are epitaxially grown the active layer 12 of non-doped InGaAsP ($\lambda g = 1.3$ microns) active and the first semiconductor layer 13 of p-InP ($\lambda g = 0.92$ micron) to thicknesses of 0.1 micron and 0.2 micron, respectively.

Referring next to FIG. 1b, a corrugation of 4000 Å in pitch and 1500 Å in trough depth is formed in the p-InP first semiconductor layer or low refractive index layer 13 by photolithography using an interferometric exposure technique and chemical etching. At this step, the etching may be so accomplished that the troughs of the corrugation reach the active layer 12. Suitable etching liquids include Br+CH$_3$OH and HCl. Use of an HCl-based etchant as etching liquid would provide the advantage of etching only the p-InP layer 13 but not the non-doped InGaAsP active layer 12. The p-InGaAsP ($\lambda g = 1.2$ microns) second semiconductor layer or high refractive index layer 14, the p-InP cladding layer 15 and the p$^+$-InGaAsP contact layer 16 are so epitaxially grown to the respective thicknesses of 0.2 micron, 3 microns and 1 micron as to bury the corrugated p-InP first semiconductor layer 13 within this structure as illustrated in FIG. 1c, which shows the completed form of the DFB LD. The thickness of the second semiconductor layer 14 is measured from the middle level between the peaks and troughs of the corrugation. Further the p-electrode 17 of AuZn alloy is formed over the p$^+$-InGaAsP contact layer 16, and the n-electrode 18 of AuGeNi alloy is formed underneath the n-InP substrate 11. In the DFB LD thereby produced, the p-InP first semiconductor layer 13, buried and having its thickness varying periodically between the active layer 12 (which has the strongest optical field) and the second semiconductor layer 14, provides an extended periodic distribution of refractive index, so that a satisfactory coupling is attained between the optical field and the grating, resulting in a satisfactory single longitudinal mode oscillation at or around the wavelength of 1.3 microns.

Figure 3:
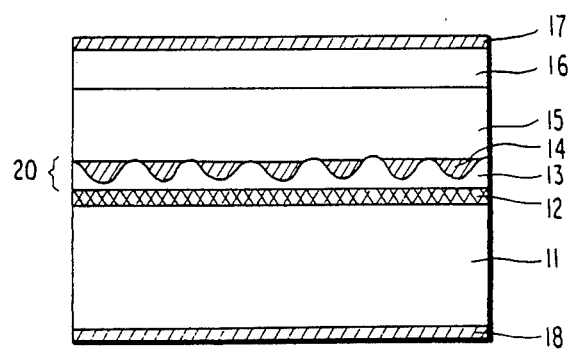
FIGS. 3 through 5 are each longitudinal sections of laser diode structures according to alternative embodiments of the invention.
Figure 4:
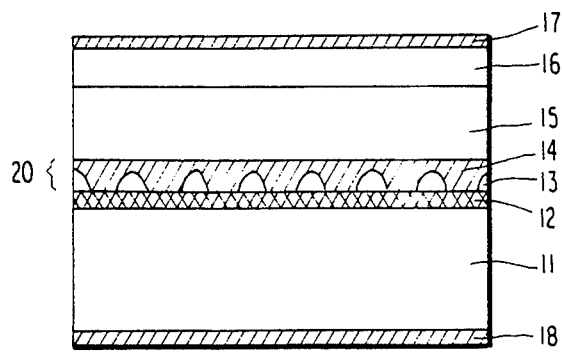

Whereas the periodic p-InP first semiconductor layer 13 is buried beneath the p-InGaAsP second semiconductor layer 14 in this preferred embodiment, the second semiconductor layer 14 may be interrupted at the peaks of the periodic corrugation as shown in FIG. 3. Furthermore, although the non-doped InGaAsP active layer 12 and the p-InP first semiconductor layer 13 are in contact with each other in this embodiment, there may as well be, sandwiched between them, a p-InGaAsP third semiconductor layer of less than 1.3 microns in bandgap wavelength. Still further, the first semiconductor layer 13 may consist of p-InGaAsP having a smaller refractive index than that of the second semiconductor layer 14. Yet further, the first semiconductor layer 13 may be periodically interrupted and, if so, may consist of an n-type semiconductor as shown in FIG. 4. If the first semiconductor layer 13 consists of an n-type semiconductor, the current will be injected through the interruptions of the periodic corrugation of this layer, so that a periodic gain distribution will be added to the periodic refractive index distribution, resulting in oscillation in an even more stable single longitudinal mode.

Figure 2A:
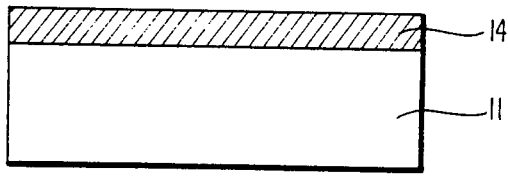
FIGS. 2a and 2b are longitudinal sections illustrating the production process of a distributed feedback laser diode (DFB LD), which a second preferred embodiment of the invention.
Figure 2B:
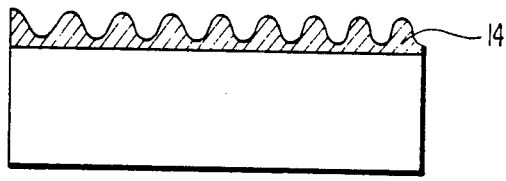
Figure 2C:
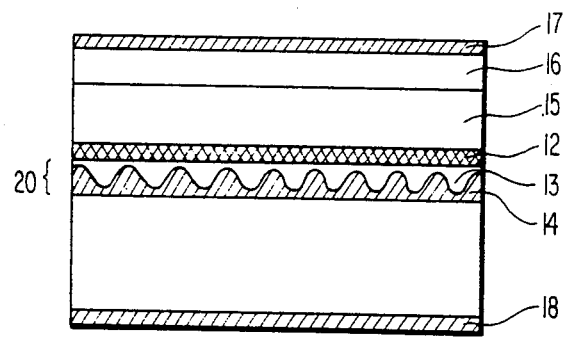
FIG. 2c is a longitudinal section of the DFB LD, the second preferred embodiment.

FIGS. 2a, 2b and 2c are sectional views illustrating the fabrication process of a DFB laser, according to a second preferred embodiment of the present invention. In the description hereunder, like reference numerals are used to denote the identical parts of the laser diodes as in the first embodiment. As is evident from FIG. 2c, this second embodiment differs from the first in that an optical waveguide 20 is formed beneath an active layer 12.

In FIG. 2a, an n-InGaAsP second semiconductor layer or high refractive index layer 14 of 1.2 microns in bandgap wavelength is epitaxially grown to a thickness of 0.2 micron over an n-InP substrate 11. Referring next to FIG. 2b, a 4000 Å grating is formed in the high refractive index layer or second semiconductor layer 14 by photolithography using an interferometric exposure technique and by chemical etching. Referring now to FIG. 2c, a low refractive index layer or n-InP first semiconductor layer 13 is so grown as to flatly fill the troughs of a corrugation formed on the surface of the high refractive index layer 14. In this approach, the first layer 13 may be periodically interrupted by the peaks of the corrugation formed on the second layer 14. Further, after forming the non-doped InGaAsP active layer 12 of 1.3 microns in bandgap wavelength to a thickness of 0.1 microns, forming a p-InP cladding layer 15 to a thickness of 3 microns and forming a p$^+$-InGaAsP contact layer 16 to a thickness of and 1 micron, there are formed a p-electrode 17 and an n-electrode 18 (FIG. 2c). The DFB laser thereby produced provides satisfactory oscillation in a single longitudinal mode in the vicinity of 1.3 microns in wavelength because, as in the first preferred embodiment, the n-InP layer 13 periodically buried in the strongest optical field gives an extended periodic distribution of refractive index.

Figure 5:
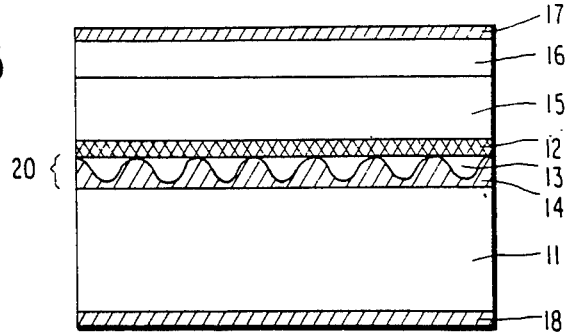

Although the n-InP first semiconductor layer 13 and the non-doped InGaAsP active layer 12 are in contact with each other in this embodiment, there may as well be, sandwiched between them, an n-InGaAsP third semiconductor layer of less than 1.3 microns in bandgap wavelength. Further, the first semiconductor layer 13 may be interrupted, as shown in FIG. 5 as long as it maintains its periodicity.

The low refractive index layer 13 in the second preferred embodiment of the present invention preferentially consists of InP, but it may be composed on n-InGaAsP having a smaller refractive index than that of the high refractive index layer 14. Further, if the low refractive index layer 13 is periodically interrupted, this layer 13 may be a p-semiconductor. In this instance, the current will be injected through the layer 13 embedded in an interrupted manner, so that a periodic gain distribution will be added to the periodic refractive index distribution, resulting in oscillation in an even more stable single longitudinal mode. The material is not limited to InP based materials, but may as well be something else, such as AlGaAs-based materials.

Although the preferred emboidments of the present invention described herein are DFB semiconductor lasers having an oscillation wavelength of approximately 1.3 microns, the pitch of the low refractive index layer 13 to be buried may be 2000 Å, half the aforementioned 4000 Å. Or if about 4700 Å or 2350 Å is selected for this pitch and 1.55 microns is chosen for the bandgap wavelength of the active layer, there will be provided a DFB laser oscillating at a wavelength of or around 1.55 microns.

A DFB laser according to the first or second preferred embodiment of the present invention has a coupling efficiency of 70 to 80 cm$^{-1}$ between the optical field and the grating, and is likely to provide a high light output of more than 30 mW.

To sum up the remarkable features of the present invention, there is achieved an extended periodic distribution of refractive index by burying in the strongest optical field a multi-layered structure. This structure comprises an active layer 12 and a periodically varying optical waveguide 14 together providing a light-propagating function. A semiconductor layer having a lower refractive index than that of the optical waveguide is placed adjacent the waveguide. As a result the DFB laser oscillates in a stable single longitudinal mode.

What is claimed is:

1. A distributed-feedback (DFB) semiconductor laser diode comprising:
    an active layer emitting light upon the injection of an electric current;
    an optical waveguide, adjoining said active layer, for guiding the light together with said active layer, said optical waveguide comprising a first semiconductor layer of a first conductivity type adjoining said active layer and having a greater bandgap than that of said active layer, said first semiconductor layer having a thickness which varies in a corrugation pattern of a prescribed pitch in the direction of said active layer, and a second semiconductor layer of the first conductivity type having a bandgap smaller than that of said first semiconductor layer but greater than that of said active layer and formed to conform to the corrugation pattern of said first semiconductor layer;
    a first cladding layer of the first conductivity type and a second cladding layer of a second conductivity type, said first and second cladding layers adjoining said optical waveguide and said active layer, respectively, and having bandgaps greater than those of said active layer and of said second semiconductor layer; and
    first and second electrodes for injecting an electric current into said active layer;
    wherein a PN junction is formed in said active layer and the light emitted from said active layer, when said PN junction is forward biased, interacts with the diffraction grating formed by the boundary of said corrugation pattern and causes said diode to lase.

2. A laser diode as recited in claim 1, wherein said optical waveguide is formed on said active layer.

3. A laser diode as recited in claim 1, wherein said active layer is formed on said optical waveguide.

4. A laser diode as recited in claim 1, further comprising a third semiconductor layer of the same conductivity type as said first semiconductor, having a bandgap less than said active layer and disposed between said active layer and said first semiconductor layer.

5. A laser diode as recited in claim 1, wherein said first and second semiconductor layers have the same conductivity type.

6. A laser diode as recited in claim 1, wherein said second semiconductor layer is periodically interrupted.

7. A laser diode as recited in claim 1, wherein said first semiconductor layer is periodically interrupted.

8. A distributed-feedback (DFB) semiconductor laser diode comprising:
    an active layer emitting light upon the injection of an electric current;
    an optical waveguide, adjoining said active layer, for guiding the light together with said active layer, said optical waveguide comprising a first semiconductor layer of a second conductivity type adjoining said active layer and having a greater bandgap than that of said active layer, said first semiconductor layer having a thickness which varies in a corrugation pattern of a prescribed pitch in the direction of said active layer, said first semiconductor layer being periodically interrupted, and a second semiconductor layer of a first conductivity type having a bandgap smaller than that of said first semiconductor layer but greater than that of said active layer and formed to conform to the corrugation pattern of said first semiconductor layer;
    a first cladding layer of the first conductivity type and a second cladding layer of the second conductivity type, said first and second cladding layers adjoining said optical waveguide and said active layer, respectively, and having bandgaps greater than those of said active layer and of said second semiconductor layer; and
    first and second electrodes for injecting an electric current into said active layer;
    wherein a PN junction is formed in said active layer and the light emitted from said active layer, when said PN junction is forward biased, interacts with the diffraction grating formed by the boundary of said corrugation pattern and causes said diode to lase.

* * * * *

UNITED STATES PATENT AND TRADEMARK OFFICE
CERTIFICATE OF CORRECTION

PATENT NO. : 4,704,720

DATED : November 3, 1987

INVENTOR(S) : Masayuki Yamaguchi

It is certified that error appears in the above-identified patent and that said Letters Patent is hereby corrected as shown below:

Column 2, line 13, after "prescribed" insert --period--.

Signed and Sealed this

Ninth Day of August, 1988

Attest:

DONALD J. QUIGG

*Attesting Officer*    *Commissioner of Patents and Trademarks*